(«12») United States Patent
Chevallier et al.

(10) Patent No.: US 9,779,788 B1
(45) Date of Patent: Oct. 3, 2017

(54) SUB-THRESHOLD ENABLED FLASH MEMORY SYSTEM

(71) Applicant: Ambiq Micro, Inc, Austin, TX (US)

(72) Inventors: Christophe J. Chevallier, Palo Alto, CA (US); Daniel M. Cermak, Austin, TX (US); Scott Hanson, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 15/245,016

(22) Filed: Aug. 23, 2016

Related U.S. Application Data

(60) Provisional application No. 62/209,275, filed on Aug. 24, 2015.

(51) Int. Cl.
    *G11C 16/10* (2006.01)
    *G11C 7/14* (2006.01)

(52) U.S. Cl.
    CPC ............... *G11C 7/14* (2013.01); *G11C 16/10* (2013.01)

(58) Field of Classification Search
    CPC .................................. G11C 16/10; G11C 7/00
    USPC ........................................ 365/189.15, 185.24
    See application file for complete search history.

(56) References Cited

U.S. PATENT DOCUMENTS

| | | | | |
|---|---|---|---|---|
| 5,886,932 | A * | 3/1999 | Choi ...................... | G05F 3/205 365/189.07 |
| 5,949,726 | A * | 9/1999 | Tseng ..................... | G11C 29/50 365/185.27 |
| 6,147,550 | A * | 11/2000 | Holloway ............... | G05F 3/205 327/538 |
| 6,151,251 | A * | 11/2000 | Campardo ............ | H01L 27/115 257/E27.103 |
| 6,434,040 | B1 * | 8/2002 | Kim ....................... | G11C 11/412 365/154 |
| 7,433,257 | B2 * | 10/2008 | Yamagami ............ | G11C 11/417 365/226 |
| 7,535,787 | B2 * | 5/2009 | Elmhurst ............ | G11C 16/3418 365/185.09 |
| 7,551,489 | B2 * | 6/2009 | Tedrow ................ | G11C 11/5642 365/185.03 |
| 7,573,775 | B2 * | 8/2009 | Fallah .................... | G11C 29/02 365/156 |
| 8,214,169 | B2 * | 7/2012 | Bhavnagarwala . | G01R 31/3016 702/117 |
| 8,669,801 | B2 * | 3/2014 | Ochoa .................. | H03H 19/004 327/278 |
| 8,885,416 | B2 * | 11/2014 | Mui ..................... | G11C 11/5642 365/185.03 |
| 9,047,945 | B2 * | 6/2015 | Sutardja ................ | G11C 7/067 |
| 9,183,912 | B2 * | 11/2015 | Gogl .................... | G11C 11/1675 |
| 9,520,189 | B1 * | 12/2016 | Papandreou ........ | G11C 13/0033 |
| 2005/0105329 | A1 * | 5/2005 | Nazarian ................ | B82Y 10/00 365/158 |
| 2007/0046589 | A1 * | 3/2007 | Furuichi .............. | G09G 3/3208 345/76 |
| 2009/0059672 | A1 * | 3/2009 | Kern ..................... | G11C 7/062 365/185.21 |

(Continued)

*Primary Examiner* — Michael Tran (57) ABSTRACT

A flash memory system for use in an electronic system comprising an integrated circuit such as a microcontroller. The flash memory system embodies one or more circuits adapted to operate at sub- or near-threshold voltage levels. These low-power circuits are selectively activated or de-activated to balance power dissipation with the response time of the memory system required in particular applications.

16 Claims, 6 Drawing Sheets

(56) References Cited

U.S. PATENT DOCUMENTS

| | | | | |
|---|---|---|---|---|
| 2010/0290287 A1* | 11/2010 | Arussi | ................ | G11C 16/3436 365/185.11 |
| 2012/0069650 A1* | 3/2012 | Yang | .................... | G11C 11/412 365/184 |
| 2012/0170391 A1* | 7/2012 | Janardan | .................. | G11C 7/04 365/194 |
| 2012/0230081 A1* | 9/2012 | Close | ..................... | G11C 5/147 365/148 |
| 2013/0135941 A1* | 5/2013 | Reohr | ................... | G11C 11/406 365/189.02 |
| 2013/0308374 A1* | 11/2013 | Gogl | .................. | G11C 11/1675 365/158 |
| 2014/0211541 A1* | 7/2014 | Sebastian | ............. | G11C 13/004 365/148 |
| 2016/0126954 A1* | 5/2016 | Zangi | ................ | H03K 19/0016 326/40 |

\* cited by examiner

SUB-THRESHOLD ENABLED FLASH MEMORY SYSTEM

CROSS-REFERENCE TO RELATED APPLICATIONS

This application is related to the following:
1. Provisional Application Ser. No. 62/066,218, filed 20 Oct. 2014 ("Parent Provisional");
2. PCT Application No. PCT/US15/50239, filed 15 Sep. 2015 ("Related Application 1");
3. U.S. application Ser. No. 14/855,105, filed 15 Sep. 2015 ("Related Application 2"); and
4. U.S. application Ser. No. 14/918,384, filed 20 Oct. 2015 ("Related Application 3").

This application claims priority to the Parent Provisional, and hereby claims benefit of the filing date thereof pursuant to 37 CFR §1.78(a)(4).

The subject matter of the Parent Provisional and all of the Related Applications, each in its entirety, is expressly incorporated herein by reference.

BACKGROUND OF THE INVENTION

1. Field of the Invention

Non-volatile semiconductor memory systems having multiple power states are described. More specifically, components and methods for improving utilization and reducing power requirements of flash memory systems that include sub- or near-threshold components are described.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single integrated circuit ("IC"), or distributed across multiple ICs. Depending on cost and other known considerations, the discrete electronic components, including the facility-instantiating IC(s), may be embodied in one or more single- or multi-chip packages. However, unless expressly stated to the contrary, the form of instantiation of any facility shall be considered as being purely a matter of design choice.

Figure 1:
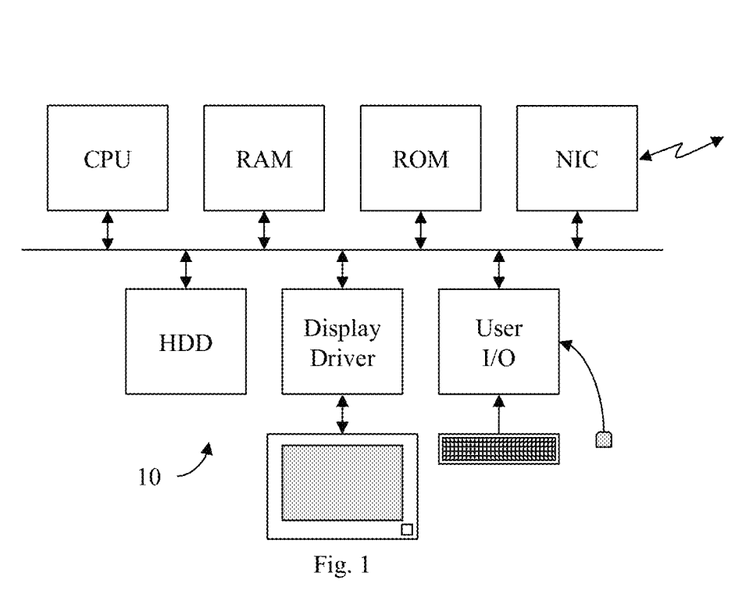
FIG. 1 illustrates, in block diagram form, a general purpose computer system adapted to instantiate any of the several embodiments.

Shown in FIG. 1 is a typical general purpose computer system 10. Although not all of the electronic facilities illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single IC. The Related Application 1 discloses several circuits adapted to operate in the sub-threshold domain.

Figure 2:
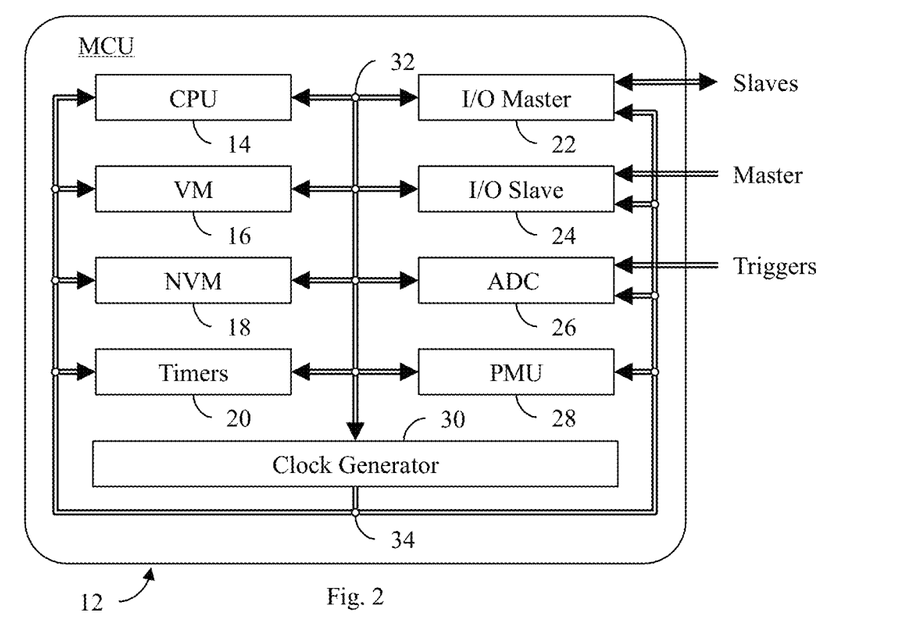
FIG. 2 illustrates, in block diagram form, a typical integrated system adapted to any of the several embodiments.

Shown by way of example in FIG. 2 is a typical single-chip microcontroller unit ("MCU") 12 comprising: a central processing unit ("CPU") 14; at least one volatile memory ("VM") facility 16; at least one non-volatile memory ("NVM") facility 18; one or more timers ("Timers") 20; at least one input/output master ("I/O Master") facility 22; at least one input/output slave ("I/O Slave") facility 24; at least one analog to digital converter ("ADC") facility 26; a power management unit ("PMU") 28; and a clock generator ("Clock Generator") facility 30. A system bus ("System Bus") 32 interconnects the several MCU facilities 14-30, and a clock distribution bus ("Clock Bus") 34 distributes all clock signals developed by the Clock Generator 30 to the respective clocked facilities. As is known, development of the several clocks is generally controlled by information written to one or more control registers within Clock Generator 30 via the System Bus 32, and by system power state information typically provided by the PMU 28.

As is known, non-volatile solid-state memory systems are widely used in a variety of mobile and handheld devices, notably smart-phones, tablets, laptops, and other consumer electronics products. Non-volatile memory, which can include embedded or stand-alone charge-based flash memory ("Flash"), phase change memory, resistive RAM ("RRAM"), or magneto-resistive memory ("MRAM"), is of particular advantage for battery operated mobile devices that have limited available power. Typically, electronic systems in such devices have processors, MCUs, or other electronic controllers that support architected power states (e.g., an active state, a stand-by or sleep state, a deep-sleep state, etc.). As compared to active states, the power consumption in these electronic systems can be significantly reduced when the device is maintained in stand-by or sleep states.

In some applications, a number of the circuits associated with the non-volatile memory facility need to be kept alive to allow for fast memory access when a memory read operation has been requested, e.g., by the CPU 14 switching from a stand-by or sleep state to an active state. Unfortunately, the current consumed by these circuits often results in unacceptable power consumption in sleep or stand-by mode. However, if these circuits are simply turned off, then the time required to turn-on the circuits, reach stability, and begin normal memory read/write operations may be unacceptably long.

BRIEF SUMMARY OF THE INVENTION

In a first embodiment, a non-volatile memory system comprises a memory array with read circuitry; a reference cell connected to the read circuitry; and a voltage reference facility connected to the reference cell and having a sub-threshold reference circuit.

In a second embodiment, a non-volatile memory system comprises a memory array with read circuitry; a reference cell connected to the read circuitry; and a voltage reference and bias generating facility connected to the reference cell, the voltage reference and bias generating facility having a both a sub-threshold reference circuit and a bias generating circuit, with the sub-threshold reference circuit switchable to an active state while the bias generating circuit is maintained in a stand-by state.

In a third embodiment, a non-volatile memory system comprises a memory array with read circuitry; a reference cell connected to the read circuitry; and a voltage reference and bias generating facility connected to the reference cell, the voltage reference and bias generating facility switchable between first mode with a sub-threshold reference circuit active and a second mode with a band-gap reference circuit active.

In a fourth embodiment, a non-volatile memory system comprises a memory array with read circuitry; a reference cell connected to the read circuitry; and a voltage reference and bias generating facility connected to the reference cell, the voltage reference and bias generating facility having a both a sub-threshold reference circuit and a bias generating circuit, with the sub-threshold reference circuit switchable to an active state while the bias generating circuit is maintained in a stand-by state.

In a fifth embodiment, a non-volatile memory system comprises a memory array with read circuitry having a read cycle time; a reference cell connected to the read circuitry; and a voltage reference and bias generating facility connected to the reference cell, the voltage reference and bias generating facility having a both a sub-threshold reference circuit and a bias generating circuit; wherein the voltage reference and bias generating facility can be switched from a light-sleep mode to an active mode in a period comprising less than 10 read cycle times.

In a sixth embodiment, a non-volatile memory system that is selectively configurable in a sleep mode and an active operation mode comprises a memory array with read circuitry having a read cycle time; a first facility adapted to be powered when the memory system is configured in either the sleep mode or the active operation mode; and a second facility adapted to be de-powered when the memory system is configured in the sleep mode, and to be powered in less than 10 read cycle times after the memory system is configured in the active operation mode.

In a seventh embodiment, a method is provided for operating a non-volatile memory system, the method comprising the steps of: applying power to a voltage reference circuit and bias facility having both a sub-threshold reference circuit and a bias circuit, each initially maintained in a stand-by state; allowing the sub-threshold reference and bias circuits to stabilize; and performing a memory operation.

In an eighth embodiment, a method is provided for operating a non-volatile memory system comprising a voltage reference and bias facility having both a sub-threshold reference circuit and a bias circuit, the method comprising the steps of: maintaining each of the reference circuit and the bias circuit in a stand-by state; fully powering only the sub-threshold reference circuit; allowing the sub-threshold reference circuit to stabilize; in response to a memory operation request: fully powering the bias circuit; allowing the bias circuit to stabilize; and performing a memory operation.

In general, a non-volatile memory facility may be configured to perform any of the methods disclosed herein.

Similarly, an electronic system may comprise a non-volatile memory facility configured to perform any of the methods disclosed herein.

Further, the methods disclosed herein may be embodied in non-volatile computer readable code on a suitable computer readable medium such that when a processor executes the computer readable code, the processor executes the respective method.

BRIEF DESCRIPTION OF THE SEVERAL VIEWS OF THE DRAWINGS

The several embodiments may be more fully understood by a description of certain preferred embodiments in conjunction with the attached drawings in which:

FIG. 7, comprising

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION OF THE INVENTION

Figure 3:
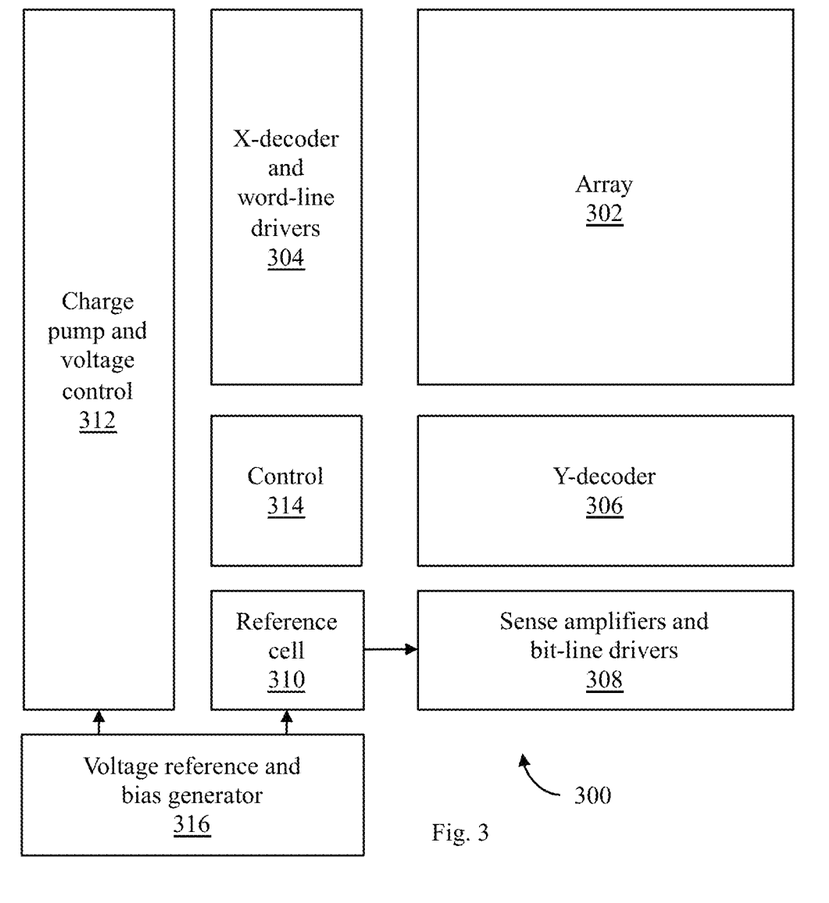
FIG. 3 illustrates, in block diagram form, one embodiment of a non-volatile memory system.

FIG. 3 schematically illustrates a block diagram of one embodiment of a non-volatile, charge-based flash memory system 300. The memory system 18 can be formed on a stand-alone flash die, or embedded with other circuits, including processors, microcontrollers, logic controllers, or sensor facilities with memory sub-systems. The memory system 300 includes a memory array 302 and supporting circuitry such as X-decoder and word-line drivers 304, Y-decoder 306, sense amplifiers and bit-line drivers 308, and a reference cell 310 that provides for charge comparison. Power to the array is provided by a charge pump and voltage control module 312, and overall control module 314 coordinates various required read, write, and power state switching activities of the memory system 300.

In accordance with one embodiment of the invention, both the charge pump and voltage control 312 and the reference cell 310 are connected to a voltage reference and bias generation facility 316. In the disclosed embodiment, special lower power circuits and operational modes can be used by the voltage reference and bias generation facility 316 to reduce power usage. Such circuits can include, but are not limited to, sub-threshold or near-threshold circuits. Advantageously, when the voltage reference and bias generation facility 316 is kept alive (i.e., at operating voltages in stand-by mode), the voltage levels and bias levels are ready to be applied to active circuitry as soon as an operation is requested from the memory system 300. As will be appreciated, a band-gap reference can be used as the voltage reference. It will also be appreciated that the reference cell 310 may include Flash memory cells similar to the Flash memory cells in array 302, but biased according to bias voltages selectively generated in block 316. Further, reference cell 310 may, if desired, include transistors biased with signals from block 316 selected so as to generate the proper reference or references for the sense amplifiers in block 308.

For even better power performance, circuits and operation can be designed for high speed switching between a sleep mode and any of a number of different active operation modes. If the voltage reference and bias generation facility 316 is disabled to save power, the memory system 300 can enter a mode usually called "deep-sleep", where power consumption is significantly reduced. Conventionally, to exit this deep-sleep mode, it takes several microseconds, as much as the equivalent of 100 read cycles, before a read operation can be executed. In the disclosed embodiment, circuitry in the voltage reference and bias generation facility 316, including a sub- or near-threshold based reference voltage circuitry, is capable of maintaining a "light-sleep" mode for flash array 302 with the power of the supply voltage being substantially lower than the active power, and a static current consumption less than $\frac{1}{10}$th of the conventional stand-by current. In general, this tends to reduce the time required to perform a fully operational read operation, e.g., to less than 500 ns (about 10 access cycles).

By way of illustration, a memory facility could be adapted selectively to operate in any one of four distinct active operation modes:
- an active mode, in which the facility is able to read data within about 20 ns after addresses are applied ("one read cycle"), consuming on the order of about 1 mA of current from the primary supply or supplies;
- a standby mode, in which the facility is able to read data within one read cycle, consuming on the order of about 10 uA of current;
- a light-sleep mode, in which the facility is able to read data within 10 read cycles, consuming on the order of about 100 nA of current; and
- a deep-sleep mode, in which the facility is able to read data within 100 read cycles, consuming on the order of about 10 nA of current.

In general, one or more control signals may be selectively asserted to determine the mode of operation of the memory facility.

It is to be noted that all, or a selected portion of, the circuits comprising the memory facility may be selectively powered off or otherwise rendered inactive or brought to a low power state in any of a number of ways familiar to those skilled in this art. For example, one way to reduce power consumption is to fully disconnect selected circuits from the facility's power supply or supplies; another way is to disable one or more of the current paths which may be necessary during regular operation; yet another way is to avoid switching within those circuits which are in an inactive state as determined by the current operating mode of the facility.

Figure 4:
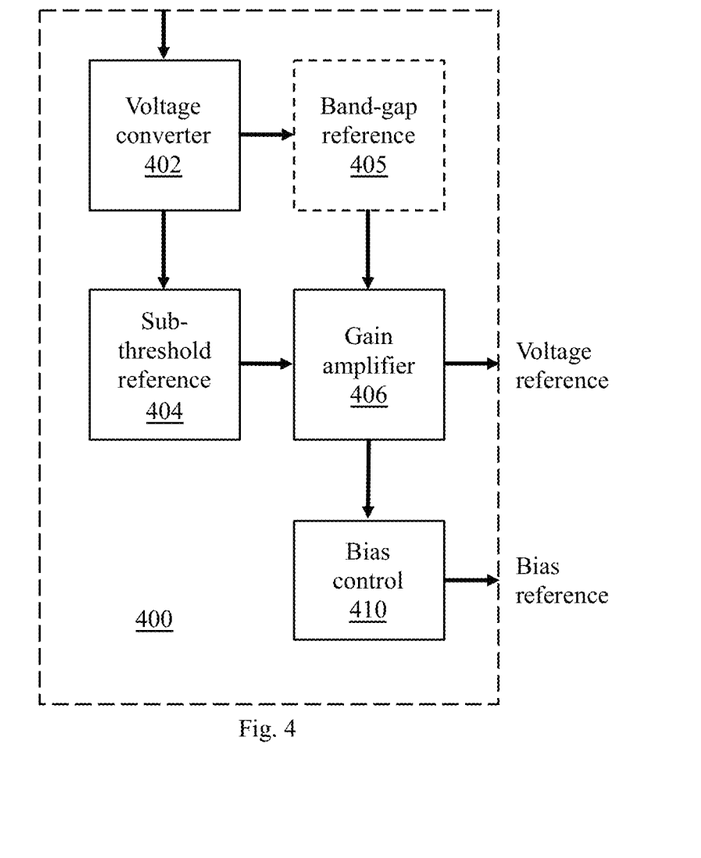
FIG. 4 illustrates, in a more detailed block diagram form, one embodiment of the voltage reference and bias generator facility of FIG. 3.

FIG. 4 illustrates details of a voltage reference and bias generation facility 400 capable of being used as voltage reference and bias generation facility 316 in the memory system 300 of FIG. 3. As illustrated in FIG. 4, the facility 400 includes voltage converter 402 connected to a sub-threshold reference source 404. The sub-threshold reference source 404 is powered by the loosely regulated voltage converter 402, drives a gain amplifier 406 to provide reference voltage sources at the desired voltage and output impedance level. An optional band-gap reference 405 (shown with dotted outline) can also be connected between the voltage converter 402 and gain amplifier 406, with selection between the sub-threshold reference source 404 and optional band-gap reference 405 being controlled by a multiplexor (not shown). In operation, the gain amplifier 406 also drives a bias control circuit 410 capable of generating one or more bias reference signals.

In operation, the bias control 410 can be switched off to minimize the stand-by current. By turning off the bias control 410, or by selecting low-power operational states for bias control 410, the facility 400 can operate in a light-sleep mode with static current consumption less than $\frac{1}{10}$th of the conventional stand-by current. In this light-sleep mode, the voltage reference and bias generation facility 400 cannot operate at nominal speed. However, since the sub-threshold voltage source is still active, the time needed for generating active levels for the voltage reference and proper bias signals is significantly reduced, especially compared to the time it would take for a conventional band-gap reference to power-up and stabilize. In one embodiment, wake-up time of less than 10 read cycles, as compared to 100 read cycles for typical conventional circuits, can be achieved.

As will be appreciated, a number of variations can be implemented, where more or less of the facility 400 circuitry is de-powered in light-sleep mode, resulting in longer or shorter wake-up times, respectively, while the power consumption is also reduced according to the number of circuits being de-powered. For example, in certain embodiments, existing conventional flash memory systems can be modified by adding both a sub-threshold reference facility and a multiplexer (not shown), and switching between standard band-gap reference or the sub-threshold voltage reference 404 when required for best performance or lowest power usage.

In one embodiment, the external power supply can be between 1.6V to 3.8V, which is regulated around 1.5V to power the sub-threshold voltage reference 404. The output of the reference source is typically set at 0.58V. This voltage can be doubled to generate close to 1.2V, which is comparable to the output voltage of a band-gap reference. Current consumption for the sub-threshold voltage reference 204 is a less than 10 nano-amps, compared to typically a few micro-amps for a band-gap reference.

Figure 5:
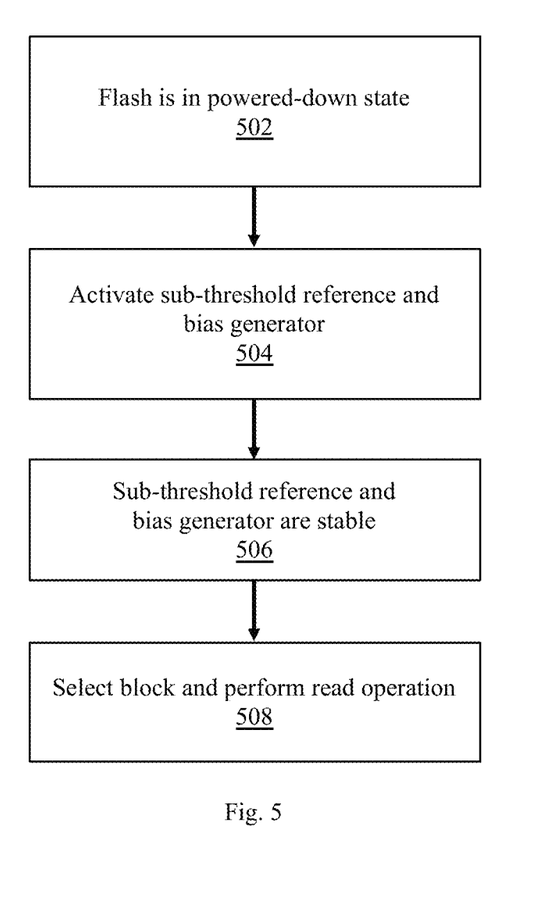
FIG. 5 illustrates, in state flow diagram form, one method for power-on method for a flash memory.

FIG. 5 is an example method implementation 500 for a solid-state memory system 300 such as discussed with respect to FIG. 3 and FIG. 4, where the reference and bias generator 316 is powered as soon as the memory system 300 is powered-up. Initially, the memory system 300 is in powered-down state (step 502). Power is then applied, and the sub-threshold reference 404 and bias control 410 are activated (step 504). When the sub-threshold reference and bias circuits are stabilized (step 506), the memory array 302 can be selected and a read or other operation performed (step 508). The described method enables a memory system 300 with very low stand-by current. As will be understood, program and erase operations can also be introduced quickly, but as is generally the case in the existing art, the program or erase operations will require additional time to prepare the necessary voltages so that the program or erase pulses can be applied.

Figure 6:
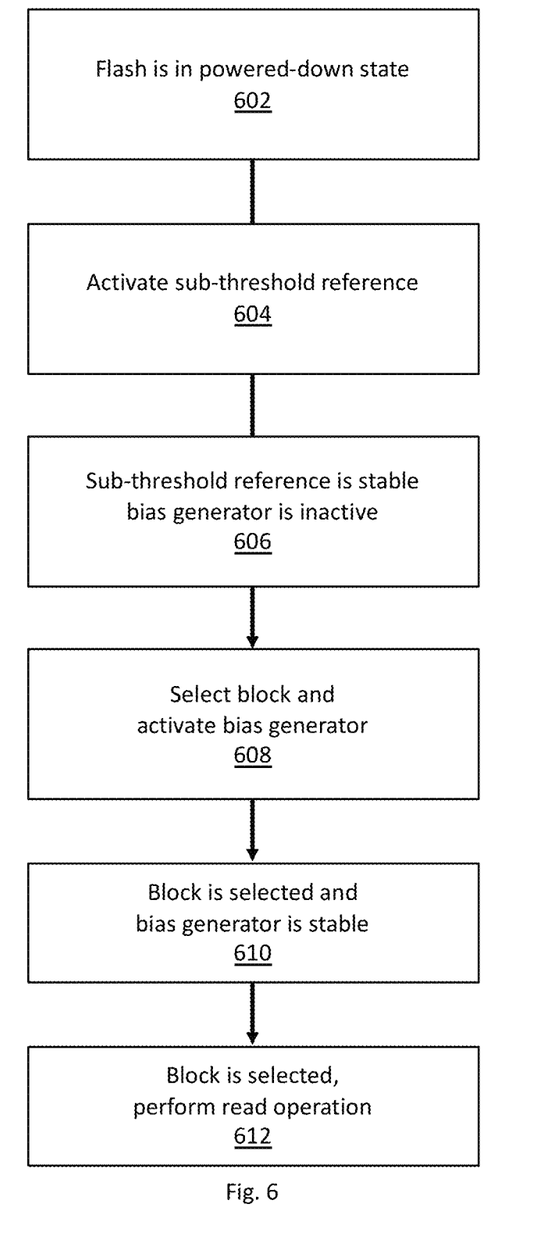
FIG. 6 illustrates, in state flow diagram form, one method for power-on of selected circuit facilities of a flash memory.

FIG. 6 is an example method implementation 600 for a memory system 300 with a low-power mode that can be switched quickly to a mode able to perform a read operation. As will be understood, the sub-threshold reference and bias circuits can be used but are not required for the described method. As in FIG. 5, initially, the memory system 300 is in a powered-down state 602. Power is then applied, and a voltage reference facility that can include, but is not limited to, sub-threshold reference 404 is activated (step 604). The voltage reference circuit (e.g., sub-threshold circuits) is allowed to stabilize and maintained in operation, while the bias control 410 facility is still inactive (step 606). This "light-sleep mode", low-powered system state is maintained until memory operations are required. Only when the memory facility is selected or a specific control signal is applied (not shown) is the bias control 410 activated (step 608), the bias control 410 allowed to stabilize (step 610), and the read or other operation performed (step 612). In effect, the sub-threshold reference 404, which is slow to wake up and designed to consume little power, is activated and maintained in operation as soon as the power is applied to the memory system 300. The bias control 410, which can be activated more quickly but consumes much more power, is activated when required at a future time. During the interval between the respective circuit activations, the memory system 300 is in a light-sleep mode having reduced power consumption, while still being able to be activated quickly.

Figure 7A:
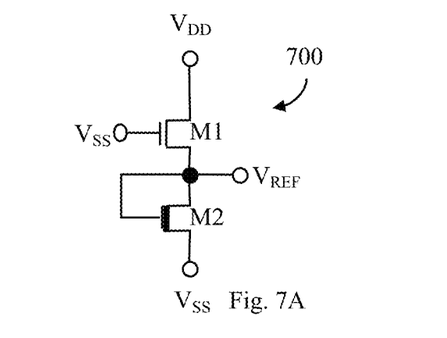
FIG. 7A, FIG. 7B, and FIG. 7C, illustrates, in circuit diagram form, embodiments of a sub-threshold voltage generator circuits suitable for use in the described non-volatile, charge-based flash memory system.
Figure 7B:
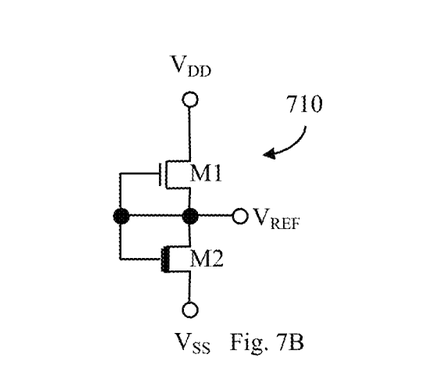
Figure 7C:
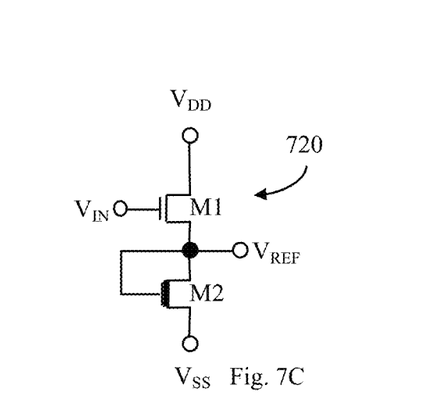

FIG. 7, comprising FIG. 7A, FIG. 7B, and FIG. 7C, illustrates examples of sub-threshold voltage generator circuits 700, 710, or 720, respectively, suitable for use in the described non-volatile charge-based flash memory system. Such circuits are capable of being used in the voltage reference and bias generator 316 facility in the memory system 300 of FIG. 3, and, in particular, in the voltage reference and bias generation facility 400 of FIG. 4. As respectively seen in FIG. 7A, FIG. 7B, and FIG. 7C, a first transistor having a gate electrode is biased to place the first transistor M1 in a weak inversion mode; and a second transistor M2 connected in series with first transistor M1 has a gate electrode biased to place the second transistor M2 in a weak inversion mode, where the threshold voltage of the first transistor M1 is smaller than the threshold voltage of the second transistor M2. In the circuit illustrated by FIG. 7A, the VREF output is created by coupling to the gate electrode of the second transistor M2, while Vss controls the gate of first transistor M1. In the circuit illustrated by FIG. 7B, the VREF output is created by coupling to the gate electrode of both the first transistor M1 and second transistor M2. In the circuit illustrated by FIG. 7C, the VREF output is created by coupling to the gate electrode of the second transistor M2, while VIN controls the gate of first transistor M1, where VIN may be a control signal or an available voltage level.

It will be apparent to those skilled in the art that various modifications and variations can be made without departing from the spirit or scope of the invention. Thus, it is intended that the disclosed embodiments cover modifications and variations that come within the scope of the claims that eventually issue in a patent(s) originating from this application and their equivalents. In particular, it is explicitly contemplated that any part or whole of any two or more of the embodiments and their modifications described above can be combined in whole or in part.

What is claimed is:

1. A non-volatile memory system comprising:
a memory array with read circuitry;
a reference cell connected to the read circuitry; and
a voltage reference facility connected to the reference cell and having a sub-threshold reference circuit adapted to operate in a sub-threshold voltage domain.

2. A non-volatile memory system comprising:
a memory array with read circuitry;
a reference cell connected to the read circuitry; and
a voltage reference and bias generating facility connected to the reference cell, the voltage reference and bias generating facility having a both a sub-threshold reference circuit and a bias generating circuit, with the sub-threshold reference circuit switchable to an active state while the bias generating circuit is maintained in a stand-by state.

3. A non-volatile memory system comprising:
a memory array with read circuitry;
a reference cell connected to the read circuitry; and
a voltage reference and bias generating facility connected to the reference cell, the voltage reference and bias generating facility switchable between first mode with a sub-threshold reference circuit active and a second mode with a band-gap reference circuit active.

4. A non-volatile memory system comprising:
a memory array with read circuitry;
a reference cell connected to the read circuitry; and
a voltage reference and bias generating facility connected to the reference cell, the voltage reference and bias generating facility having a both a sub-threshold reference circuit and a bias generating circuit, with the sub-threshold reference circuit switchable to an active state while the bias generating circuit is maintained in a stand-by state.

5. A non-volatile memory system comprising:
a memory array with read circuitry having a read cycle time;
a reference cell connected to the read circuitry; and
a voltage reference and bias generating facility connected to the reference cell, the voltage reference and bias generating facility having a both a sub-threshold reference circuit and a bias generating circuit;
wherein the voltage reference and bias generating facility can be switched from a light-sleep mode to an active mode in a period comprising less than 10 read cycle times.

6. A non-volatile memory system selectively configurable in a sleep mode and an active operation mode, the system comprising:
a memory array with read circuitry having a read cycle time;
a first facility adapted to be powered when the memory system is configured in either the sleep mode or the active operation mode; and
a second facility adapted to be de-powered when the memory system is configured in the sleep mode, and to be powered in less than 10 read cycle times after the memory system is configured in the active operation mode.

7. The non-volatile memory system of claim 6 wherein the second facility consumes substantially more power than the first facility.

8. The non-volatile memory system of claim 6 wherein the first facility comprises at least one transistor adapted to operate in a selected one of a sub-threshold domain and a near-threshold domain.

9. The non-volatile memory system of claim 6 wherein the active operation mode is further characterized as comprising a plurality of distinct active operation modes.

10. A method for operating a non-volatile memory system comprising:

a memory array adapted to develop an array signal; and
a reference cell adapted to develop a reference signal,
the method comprising the steps of:
    applying power to a voltage reference and bias facility having both a sub-threshold reference circuit and a bias circuit, each initially maintained in a stand-by state;
    allowing the sub-threshold reference and bias circuits to stabilize;
    developing a selected reference voltage via the voltage reference and bias facility;
    developing the reference signal as a function of the reference voltage; and
    performing a memory read operation comprising comparing the array signal to the reference signal.

11. A method for operating a non-volatile memory system comprising a voltage reference and bias facility having both a sub-threshold reference circuit and a bias circuit, the method comprising the steps of:
    [11.1] maintaining each of the reference circuit and the bias circuit in a stand-by state;
    [11.2] fully powering only the sub-threshold reference circuit;
    [11.3] allowing the sub-threshold reference circuit to stabilize;
    [11.4] in response to a memory operation request:
        [11.4.1] fully powering the bias circuit;
        [11.4.2] allowing the bias circuit to stabilize; and
        [11.4.3] performing a memory operation.

12. The method of claim 11 further comprising the step of:
    [11.5] selectively returning to step 11.1.

13. The method of claim 11 wherein, in step 11.1, the stand-by state comprises a selected one of a low-power state and an off state.

14. A non-volatile memory facility configured to perform the method of any one of claims 10 through 13.

15. An electronic system comprising a non-volatile memory facility according to claim 14.

16. A non-volatile computer readable medium including executable instructions which, when executed in a processing system, causes the processing system to perform the steps of a method according to any one of claims 10 through 13.

\* \* \* \* \*